US007430103B2

(12) United States Patent
Kato

(10) Patent No.: US 7,430,103 B2
(45) Date of Patent: Sep. 30, 2008

(54) STATIC ELECTRICITY PROTECTIVE CIRCUIT AND HIGH-FREQUENCY CIRCUIT APPARATUS INCORPORATING THE SAME

(75) Inventor: Masahiro Kato, Nagaokakyo (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 223 days.

(21) Appl. No.: 10/937,490

(22) Filed: Sep. 10, 2004

(65) Prior Publication Data

US 2005/0063129 A1    Mar. 24, 2005

(30) Foreign Application Priority Data

Sep. 19, 2003  (JP) ............................. 2003-327676
Mar. 29, 2004  (JP) ............................. 2004-094078

(51) Int. Cl.
*H02H 9/00* (2006.01)

(52) U.S. Cl. ........................................ 361/212; 361/56

(58) Field of Classification Search ................. 361/212, 361/56
See application file for complete search history.

(56) References Cited

U.S. PATENT DOCUMENTS

| 3,213,389 | A | * | 10/1965 | Campi et al. | ............... 331/99 |
| 5,095,285 | A | * | 3/1992 | Khatibzadeh | ............... 330/306 |
| 5,300,897 | A | * | 4/1994 | Shiga | ............... 330/298 |
| 5,712,755 | A | * | 1/1998 | Glaser et al. | ............... 361/119 |
| 5,969,929 | A | * | 10/1999 | Kleveland et al. | ............... 361/111 |
| 6,914,304 | B2 | * | 7/2005 | Busson et al. | ............... 257/355 |
| 2005/0059358 | A1 | * | 3/2005 | Block et al. | ............... 455/78 |

FOREIGN PATENT DOCUMENTS

| JP | 63-105517 | A | | 5/1988 |
| JP | 1-103300 | U | | 7/1989 |
| JP | 4-53161 | A | | 2/1992 |
| JP | 6-204407 | A | | 7/1994 |
| JP | 7-33052 | U | | 6/1995 |
| JP | 11-67486 | | * | 9/1999 |
| JP | 2000-245057 | A | | 9/2000 |
| JP | 2001-257311 | A | | 9/2001 |
| WO | WO-00/44049 | A2 | | 7/2000 |

* cited by examiner

*Primary Examiner*—Stephen W Jackson
(74) *Attorney, Agent, or Firm*—Birch, Stewart, Kolasch & Birch, LLP

(57) ABSTRACT

A static electricity protective circuit for use in a high-frequency apparatus for protecting, against static electricity, an internal circuit connected to a signal terminal through which a high-frequency signal and a DC signal are superimposed and transmitted, comprises a high-frequency cut-off element having one end thereof connected to the signal terminal, and a Schottky barrier diode having a cathode thereof connected to other end of the high-frequency cut-off element and an anode thereof connected to ground, wherein the high-frequency cut-off element and the Schottky barrier diode cut off the high-frequency signal and the DC signal respectively and lead static electricity applied to the signal terminal to ground so as to protect the internal circuit against the static electricity.

28 Claims, 11 Drawing Sheets

FIG. 17       CONVENTIONAL ART
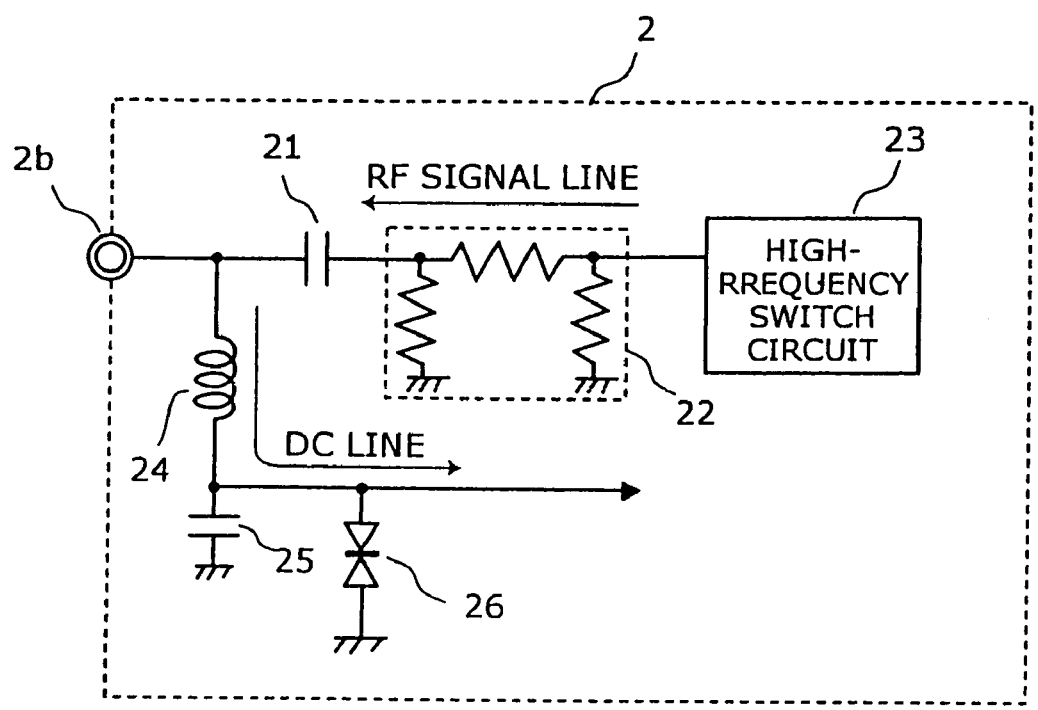

STATIC ELECTRICITY PROTECTIVE CIRCUIT AND HIGH-FREQUENCY CIRCUIT APPARATUS INCORPORATING THE SAME

BACKGROUND OF THE INVENTION

This non-provisional application claims priority under 35 U.S.C. § 119(a) on Patent Application No. 2003-327676 filed in Japan on Sep. 19, 2003 and Patent Application No. 2004-094078 filed in Japan on Mar. 29, 2004, the entire contents of which are hereby incorporated by reference.

1. Field of the Invention

The present invention relates to a static electricity protective circuit, and in particular, to a static electricity protective circuit for use in a high-frequency circuit apparatus such as a converter, an IF signal switching apparatus, or a reception apparatus for receiving satellite broadcasts.

2. Description of the Related Art

Among high-frequency apparatuses, there are a low-noise block down-converter (LNB) which is a reception apparatus for receiving satellite broadcasts, a receiver, and an IF signal switching unit (switch box) connected between the LNB and the receiver so as to select a signal from among IF (intermediate frequency) signals. Since a core conductor used for input and output terminals provided in these high-frequency apparatuses is directly connected to an internal circuit of the high-frequency apparatuses, devices such as transistors that constitute the internal circuit may be deteriorated or damaged, if static electricity is applied to the core conductor of the input and output terminals.

FIG. 13A is an exterior view of an ordinary LNB, and FIG. 13B is an exterior view of an ordinary switch box. FIG. 13C is an exterior view showing a connection between the ordinary LNB and an ordinary receiver. In these drawings, reference numeral 1 represents an LNB; reference numeral 2 represents a switch box; and reference numeral 3 represents a receiver such as, for example, a tuner or a television receiver.

The LNB 1 has a signal terminal 1a from which an intermediate-frequency signal (IF signal) is outputted. The switch box 2 has, for example, three connecting terminals (signal terminals) 2a to be connected to the LNB 1 and, for example, four connecting terminals (signal terminals) 2b to be connected to the receiver 3. It is to be noted that the number of connecting terminals 2a or 2b provided in the switch box 2 is not limited to these examples. It is also to be noted that, if the switch box 2 is not used, then, as shown in FIG. 13C, the signal terminal 1a of the LNB 1 is directly connected to a signal terminal 3a of the receiver 3 by a cable 4 such as a coaxial cable.

Because the signal terminal 1a of the LNB 1 and the connecting terminals 2a and 2b of the switch box 2 are exposed to the environment, static electricity built up externally may be applied to the core conductor of the signal terminal 1a or to the core conductors of the connecting terminals 2a or 2b when, for example, a connecting cable is connected thereto, or when the LNB 1 or the switch box 2 wrapped with such a material as vinyl which easily causes static building is unpacked. Since these core conductors are directly connected to the internal circuit of the LNB 1 or the switch box 2, devices such as transistors which constitute the internal circuit may be deteriorated or damaged, if static electricity is applied to these core conductors.

To prevent this from happening, the LNB 1 has a function of protecting the internal circuit thereof from static electricity. FIG. 14 is a circuit diagram showing a partial internal circuit of a conventional LNB. Reference numeral 1a represents the signal terminal which is to be connected to the receiver 3 shown in FIG. 13C. Through the signal terminal 1a, an IF signal of which a frequency is converted by the internal circuit of the LNB 1 is fed out and, at the same time, DC current is supplied from the receiver 3 as a power source for driving the LNB 1. To be more specific, the IF signal and the DC current are superimposed and supplied to the signal terminal 1a. For this reason, inside the LNB 1, an RF signal line through which the IF signal, i.e., an RF (radio-frequency) signal, is transmitted and a DC line through which the DC current is supplied, are separated from each other.

First, a configuration of an RF signal line side will be described. The signal terminal 1a is connected, through a ceramic capacitor 11, to one end of an attenuator 12 that performs an impedance matching. Other end of the attenuator 12 is connected to an RF amplifier 14 through a ceramic capacitor 13. The RF amplifier 14 amplifies a satellite broadcasting signal received by the LNB 1 and mixes the amplified signal with a locally oscillated signal so as to obtain and output an IF signal of which the frequency is converted.

Next, a configuration of a DC line side will be described. One end of a microstrip line 15 is connected to the signal terminal 1a and other end thereof is connected to ground through a by-pass capacitor 16. Moreover, the DC current that is supplied from the receiver 3 is extracted from a node between the microstrip line 15 and the capacitor 16 as a power source for the internal circuit of the LNB 1. At the same time, a surge absorber 17 is connected between the node and ground. Here, a line length of the microstrip line 15 is so adjusted as to be equal to a quarter of a wavelength of the frequency of the IF signal.

In this configuration, the IF signal transmitted from the RF amplifier 14 and the DC current supplied from the receiver 3 are superimposed with each other at the signal terminal 1a. Since DC components of the DC current are cut off by the capacitors 11 and 13, the DC current never flows through the attenuator 12 and the RF amplifier 14. Furthermore, the microstrip line 15 having a line length equal to a quarter of the wavelength of the frequency of the IF signal exhibits a low impedance to the DC current and current at a relatively low frequency, and exhibits a high impedance to the IF signal which is a high frequency signal. As a result of this, the IF signal never leaks through to the DC line or ground. To be more specific, transmission losses of the IF signal will not be caused.

If static electricity or a surge current is applied to the signal terminal 1a, the microstrip line 15 acts as a low-impedance conductor for the static electricity or the surge current, because most of frequency components of the static electricity or the surge current are DC components or AC components at relatively low frequencies. The surge absorber 17 also exhibits a low impedance to the static electricity or the surge current applied thereto. As a result of this, most part of the static electricity or the surge current applied thereto is dissipated to ground through the microstrip line 15 and the surge absorber 17, and the internal circuit of the LNB 1 will not be affected by the static electricity or the surge current. In this way, the LNB 1 is protected against the static electricity and the surge current.

Next, before explaining how the switch box 2 is protected against the static electricity or the surge current will be described, functions of the switch box 2 will be described. FIG. 15 is an exterior view showing an interconnection among the LNB, the switch box, and the receiver. FIG. 16 is an exterior view showing another interconnection among the LNBs, the switch box, and the receivers. In FIGS. 15 and 16, such components as are found also in FIGS. 13A to 13C are identified with the same reference numerals and descriptions thereof will not be repeated. FIG. 15 shows a case in which one LNB 1 and one receiver 3 are connected to the switch box 2. FIG. 16 shows a case in which three LNBs 1 and three receivers 3 are connected to the switch box 2. As shown in FIGS. 15 and 16, the switch box 2 is connected to the LNB(s) 1 and the receiver(s) 3 in such a way as to be placed in between them. In other words, in FIG. 16, each connecting terminal 2*a* of the switch box 2 is connected to the signal terminal 1*a* of each of the plurality of LNBs 1 independently by a cable 4*a* such as a coaxial cable. Also, each connecting terminal 2*b* of the switch box 2 is connected to the signal terminal 3*a* of each of the plurality of receivers 3 independently by a cable 4*b* such as a coaxial cable.

The switch box 2 to be connected in this way is a unit having a function as a switch for changing signal paths between the LNBs 1 and the receivers 3 so that an IF signal sent out from one LNB 1 can be received by the plurality of receivers 3, or a desired IF signal can be selected, at the receiver 3, from among the IF signals sent out from the plurality of LNBs 1. To achieve this, the switch box 2, according to a selection control signal transmitted from the receiver 3, selects the IF signal from among signals sent out from the plurality of LNBs 1 and leads the selected IF signal to a predetermined connecting terminal 2*b*. The selection control signal transmitted from the receiver 3 is fed from the signal terminal 3*a* of the receiver 3 to the connecting terminal 2*b* of the switch box 2 as a digital signal in pulses. DC current is supplied from the signal terminal 3*a* of the receiver 3 to the connecting terminal 2*b* of the switch box 2 as a power source for driving the switch box 2 and the LNB 1 connected thereto. Since the IF signal, the selection control signal, and the DC current are fed to and superimposed with one another at the connecting terminal 2*b* of the switch box 2, these signals are separated as AC components and DC components in the switch box 2. Moreover, the IF signal fed from the LNB 1 and the DC current to be supplied thereto are fed to and superimposed with each other at the connecting terminal 2*a* of the switch box 2.

FIG. 17 is a circuit diagram showing a partial internal circuit of the conventional switch box 2. Reference numeral 2*b* represents a connecting terminal to be connected to the receiver 3. An IF signal is transmitted to the connecting terminal 2*b* from the LNB 1 through a high-frequency switch circuit 23 which is one of the internal circuits. At the same time, DC current is supplied thereto from the receiver 3. As a result, the IF signal and the DC current are supplied to and superimposed with each other at the connecting terminal 2*b*. For this reason, inside the switch box 2, an RF signal line through which the IF signal, i.e., the RF signal, is transmitted and a DC line through which the DC current is supplied, are separated from each other. Here, because an internal circuit connected to the connecting terminal 2*a* of the switch box 2 is configured in the same manner as the internal circuit 23 connected to the connecting terminal 2*b*, the description thereof will be omitted.

First, a configuration of an RF signal line side will be described. The connecting terminal 2*b* is connected, through a ceramic capacitor 21, to one end of an attenuator 22 that performs an impedance matching. Other end of the attenuator 22 is connected to the high-frequency switch circuit 23. The high-frequency switch circuit 23 is a switch circuit for selecting the LNB 1 to be connected to the receiver 3 in accordance with the selection control signal transmitted from the receiver 3 or selecting the IF signal from the LNB 1 so as to distribute the selected signal to the plurality of receivers 3.

Next, a configuration of a DC line side will be described. One end of a choke coil 24 is connected to the connecting terminal 2*b* and other end thereof is connected to ground through a capacitor 25. The DC current that is supplied from the receiver 3 is extracted from a node between the choke coil 24 and the capacitor 25 as a power source for driving the switch box 2 and the LNB 1. In addition, a surge absorber 26 is connected between the node and ground.

In this configuration, the IF signal transmitted from the high-frequency switch circuit 23 and the DC current supplied from the receiver 3 are superimposed with each other at the connecting terminal 2*b*. Since DC components of the DC current are cut off by the capacitor 21, the DC current never flows through the attenuator 22 and the high-frequency switch circuit 23. Furthermore, since only the DC components or low-frequency components flow through the DC line by way of the choke coil 24, and the IF signal is cut off by the choke coil 24, the IF signal never leaks through to the DC line or ground. As a result, transmission loses of the IF signal will not be caused. In this example, to prevent the IF signal from leaking from the RF signal line to the DC line, the choke coil 24 is used as a high-frequency cut-off element in lieu of the microstrip line 15 shown in FIG. 14. The reason for this will be described below.

As described above, the DC current supplied from the switch box 2 serves as a power source for driving the switch box 2 and the LNB 1. Because of this reason, a level of the DC current flowing through the DC line of the switch box 2 will be amounting to a sum of current for driving the switch box 2 and current for driving the LNB 1. If a plurality of LNBs 1 or a plurality of receivers 3 are connected, then the level of the DC current increases. Furthermore, it is desired that the power supply line (DC line) be designed to withstand an overcurrent so that the switch box 2 will not be destroyed by the current flowing from the switch box 2 into the LNB 1 even if a power supply circuit of the LNB 1 connected to the switch box 2 is short-circuited. Because of this reason, the choke coil 24 having a larger current-carrying capacity than the microstrip line 15 is used so as to permit a larger amount of current to pass through the DC line.

Furthermore, protection of the internal circuit is also provided by arranging the chock coil 24 and the surge absorber 26 so as to permit static electricity and a surge current to flow therethrough to ground if the static electricity or the surge current is applied to the connecting terminal 2*b*.

As another conventional technology, Japanese Utility Model Laid-Open No. H01-103300 discloses a static electricity protective device for protecting an internal circuit of an electronic control apparatus having an input/output connector against high-voltage static electricity. According to the disclosure, a conductor having a plurality of sharp-point projections that form gaps for allowing electrical discharge between the projections and each of connector terminal pins, is provided in an input/output connector case, wherein the conductor is grounded.

Japanese Patent Application Laid-Open No. 2001-257311 discloses an electrostatic protective circuit for protecting a semiconductor device. In the circuit, a series combination of a fuse and a capacitor is inserted between a signal terminal and an inner circuit.

International Patent Publication WO00044049 discloses a circuit for protecting against static electricity, comprising a first power supply terminal to which a first voltage is applied, a second power supply terminal to which a second voltage lower than the first voltage is applied, a signal terminal to which a signal voltage lower than the first voltage and higher than the second voltage is applied, a first diode connected in forward direction between the first power supply terminal and the signal terminal, a second diode connected in forward direction between the signal terminal and the second power supply terminal, a third diode connected in reverse direction between the first power supply terminal and the signal terminal, and a fourth diode connected in reverse direction between the signal terminal and the second power supply terminal, wherein forward voltage drops caused across the first and second diodes individually are so set as to be higher than a driving voltage supplied between the first and second power supply terminals.

Japanese Patent Application Laid-Open No. H06-204407 discloses a diode element comprising a diffused layer formed on a substrate surface and an inner surface of a trench arranged in a semiconductor substrate, and a metal layer formed in the trench and on the semiconductor substrate.

Japanese Patent Application Laid-Open No. H04-053161 discloses a static electricity protective circuit for preventing an input circuit incorporating a switch from being destroyed by static electricity that is applied by an operator and flows through the input circuit when the switch is operated. The static electricity protective circuit comprises two diodes connected in series of which a node is connected to a terminal of the switch, and a resistor connected between the node and the input circuit.

Japanese Patent Application Laid-Open No. S63-105517 discloses a protection circuit against static electricity, having either a diode connected between a terminal and a positive power supply or a diode connected between the terminal and a negative power supply, and having a parasitic diode residing between the positive and negative power supplies, wherein at least one diode among the plurality of diodes shall be replaced with a plurality of diodes having different reverse dielectric strength.

Japanese Utility Model Laid-Open No. H07-033052 discloses adding a reverse current preventing diode into a high-level output side circuit of an output buffer and using a Zener diode as a static electricity protective diode for protecting an input buffer.

Japanese Patent Application Laid-Open No. 2000-245057 discloses an ultra high-frequency circuit and its static electricity protecting method, wherein a combination of a microstrip line having a line length equal to a quarter of a wavelength, a resistor, and a capacitor is used.

However, because the conventional LNB 1 shown in FIG. 14 and the conventional switch box 2 shown in FIG. 17 are so configured that the DC current flows through the microstrip line 15 or the choke coil 24, it is necessary to use the elements having a larger current-carrying capacity when a larger DC current is used. This prevents reductions in size and cost. Furthermore, when the choke coil 24 is used, depending on the frequency components of the static electricity, it is possible that the impedance thereof is increased and, thereby, the protection performance against the static electricity is hampered.

According to the conventional technology described in Japanese Utility Model Laid-Open No. H01-103300, when a high-frequency signal is fed to the connector pins, transmission losses are caused in the high-frequency signal because of a leakage thereof caused by a capacitance formed by the gap for allowing electrical discharges.

According to the conventional technology described in Japanese Patent Application Laid-Open No. 2001-257311, the electrostatic protective circuit effectively operates only when the semiconductor device remains unused before it is mounted. Once the semiconductor device is mounted, the fuse in the electrostatic protective circuit is blown off, making the protective function against the static electricity inoperative.

According to the conventional technology disclosed in International Patent Publication W00044049, when a high-frequency signal is fed to the signal terminal, the high-frequency signal leaks to the first and second power supply terminals through each of the first to the fourth diodes, causing transmission losses of the high-frequency signal.

Since the diode element described in Japanese Patent Application Laid-Open No. H06-204407 is a Schottky barrier diode that occupies a smaller area and can be integrated in high packaging densities, it is possible to configure a static electricity protective circuit capable of operating at high speed while taking up a smaller area if such a diode element is used for the static electricity protective circuit. However, if such a protective circuit with the diode element alone is used for a high-frequency signal circuit, the high-frequency signal leaks, causing transmission losses thereof.

According to the conventional technology described in Japanese Patent Application Laid-Open No. H04-053161, the power supply line to which the two diodes are connected for leading the static electricity applied to the input circuit and the power supply line for the input circuit belong to different systems. Furthermore, the circuit is designed by excluding a possibility of a high-frequency signal being applied to the input circuit. For this reason, if a high-frequency signal is fed to the input circuit, transmission losses in the high-frequency signal are caused by the two diodes.

According to the conventional technology described in Japanese Patent Application Laid-Open No. S63-105517, it is necessary to provide one of positive and negative power supplies to which a diode for leaking the static electricity applied to the terminal is connected, and, therefore, it is impossible to protect a terminal to which a DC signal as a power supply and a high-frequency signal are superimposed with each other and fed. In addition, the high-frequency signal leaks through the diode, causing transmission losses in the high-frequency signal.

According to the conventional technology described in Japanese Patent Application Laid-Open No. H07-033052, the reverse current protection diode is for preventing a current caused by a difference between an output level and a reception level for receiving it, from flowing in reverse direction, and is irrelevant to the protection against static electricity. Moreover, because the static electricity protective diode for protecting the input buffer is placed between an input signal line and ground, if an input signal is a high-frequency signal, it is possible that the high-frequency signal leaks to ground due to a capacitance parasitic in the static electricity protective diode.

The static electricity protecting method used in the conventional technology described in Japanese Patent Application Laid-Open No. 2000-245057 provides effective protection against the static electricity for a high-frequency circuit. However, a combination of a resistor, a microstrip line, a capacitor, and two diodes is required for one terminal to protect against static electricity applied thereto. This requires an increased number of components for such apparatuses as an LNB of which a miniaturization is demanded. Because an ordinary diode is used, it is also possible that the diode itself may be damaged depending on the nature of static electricity applied thereto.

SUMMARY OF THE INVENTION

The present invention provides a static electricity protective circuit and a high-frequency circuit apparatus incorporating the same, which are capable of providing protection against static electricity for an internal circuit connected to a signal terminal through which a high-frequency signal and a DC current are superimposed and transmitted.

According to one aspect of the invention, a static electricity protective circuit for use in a high-frequency apparatus for protecting, against static electricity, an internal circuit connected to a signal terminal through which a high-frequency signal and a DC signal are superimposed and transmitted, comprises a high-frequency cut-off element having one end thereof connected to the signal terminal, and a Schottky barrier diode having a cathode thereof connected to other end of the high-frequency cut-off element and an anode thereof connected to ground, wherein the high-frequency cut-off element and the Schottky barrier diode cut off the high-frequency signal and the DC signal respectively and lead static electricity applied to the signal terminal to ground so as to protect the internal circuit against the static electricity.

By this arrangement, it is possible to prevent the high-frequency signal from leaking by means of the high-frequency cut-off element, and prevent the DC signal from flowing through to ground by means of the Schottky barrier diode. Thus, it is possible to protect the internal circuit against the static electricity by leading the static electricity which is applied to the signal terminal to ground through the high-frequency cut-off element and the Schottky barrier diode.

According to another aspect of the invention, the high-frequency cut-off element is one of an inductor, a microstrip line, a microstrip line having a line length equal to a quarter of a wavelength of the high-frequency signal, and one of said microstrip lines has, around a perimeter thereof, a discharge ground pattern for discharging the static electricity applied to the signal terminal to ground. According to this arrangement, it is possible to cut off the high-frequency signal effectively, prevent the high-frequency signal from leaking to ground, and lead to ground the static electricity not including frequency components that would otherwise be cut off so as to protect the internal circuit against the static electricity.

According to another aspect of the invention, a static electricity protective circuit for use in a high-frequency apparatus for protecting, against static electricity, an internal circuit connected to a signal terminal through which a high-frequency signal and a DC signal are superimposed and transmitted, comprises at least two trap circuits having one end thereof connected to a transmission line for connecting a DC cut-off capacitor that cuts off the DC signal to the signal terminal, and other end thereof connected to ground, each of the trap circuits comprising: a high-frequency cut-off element having one end thereof connected to the transmission line; and a Schottky barrier diode having a cathode thereof connected to other end of the high-frequency cut-off element and an anode thereof connected to ground, and a resistor inserted in between nodes at which the transmission line and each of the trap circuits are connected together, wherein the high-frequency cut-off element and the Schottky barrier diode cut off the high-frequency signal and the DC signal respectively and lead static electricity applied to the signal terminal to ground so as to protect the internal circuit against the static electricity.

By this arrangement, it is possible to prevent the high-frequency signal from leaking by means of the high-frequency cut-off element of each trap circuit and prevent the DC signal from flowing through to ground by means of the Schottky barrier diode through its reverse voltage characteristic. Thus, it is possible to protect the internal circuit against the static electricity by leading the static electricity which is applied to the signal terminal to ground through the high-frequency cut-off element of each trap circuit and the Schottky barrier diode. Furthermore, it is also possible to attenuate, by inserting the resistor in the transmission line, a rise in voltage in the DC cut-off capacitor caused by applications of static electricity thereto, and, thereby, suppress accumulation of electricity in the DC cut-off capacitor so as to protect it from deterioration and damage.

According to another aspect of the invention, the high-frequency cut-off element is one of an inductor, a microstrip line, a microstrip line having a line length equal to a quarter of a wavelength of the high-frequency signal, and one of said microstrip lines has, around a perimeter thereof, a discharge ground pattern for discharging the static electricity applied to the signal terminal to ground. According to this arrangement, it is possible to cut off the high-frequency signal effectively, prevent the high-frequency signal from leaking to ground, and lead to ground the static electricity not including frequency components that would otherwise be cut off so as to protect the internal circuit against the static electricity.

According to another aspect of the invention, a static electricity protective circuit for use in a high-frequency apparatus for protecting, against static electricity, an internal circuit connected to a signal terminal through which a high-frequency signal and a DC signal are superimposed and transmitted, comprises at least two trap circuits having one end thereof connected to a transmission line for connecting a DC cut-off capacitor that cuts off the DC signal to the signal terminal and other end thereof connected to ground, each of the trap circuits comprising: a high-frequency cut-off element having one end thereof connected to the transmission line; and a Schottky barrier diode having a cathode thereof connected to other end of the high-frequency cut-off element and an anode thereof connected to ground, and a capacitor inserted in between nodes at which the transmission line and each of the trap circuits are connected together, wherein the high-frequency cut-off element and the Schottky barrier diode cut off the high-frequency signal and the DC signal respectively and lead static electricity applied to the signal terminal to ground so as to protect the internal circuit against the static electricity.

By this arrangement, it is possible to prevent the high-frequency signal from leaking by means of the high-frequency cut-off element of each trap circuit and prevent the DC signal from flowing through to ground by means of the Schottky barrier diode through its reverse voltage characteristic. Thus, it is possible to protect the internal circuit against the static electricity by leading the static electricity applied to the signal terminal to ground through the high-frequency cut-off element of each trap circuit and the Schottky barrier diode. Furthermore, it is also possible to attenuate, by inserting the capacitor in the transmission line, a rise in voltage in the DC cut-off capacitor caused by applications of static electricity thereto, and, thereby, suppress accumulation of electricity in the DC cut-off capacitor so as to protect it from deterioration and damage.

According to another aspect of the invention, the high-frequency cut-off element is one of an inductor, a microstrip line, a microstrip line having a line length equal to a quarter of a wavelength of the high-frequency signal, and one of said microstrip lines has, around a perimeter thereof, a discharge ground pattern for discharging the static electricity applied to the signal terminal to ground. According to this arrangement, it is possible to cut off the high-frequency signal effectively, prevent the high-frequency signal from leaking to ground, and lead to ground the static electricity not including frequency components that would otherwise be cut off so as to protect the internal circuit against the static electricity.

According to another aspect of the invention, a static electricity protective circuit for use in a high-frequency apparatus for protecting, against static electricity, an internal circuit connected to a signal terminal through which a high-frequency signal and a DC signal are superimposed and transmitted, comprises a first trap circuit comprising: a first high-frequency cut-off circuit having one end thereof connected to a transmission line for connecting a DC cut-off capacitor that cuts off the DC signal to the signal terminal; and a Schottky barrier diode having a cathode thereof connected to other end of the first high-frequency cut-off circuit and an anode thereof connected to ground, a capacitor inserted in between the DC cut-off capacitor and a node at which the transmission line and the first trap circuit are connected together; and a second trap circuit comprising a second high-frequency cut-off element having one end thereof connected to a line that connects the DC cut-off capacitor to the capacitor and having other end thereof connected to ground, wherein the first and second high-frequency cut-off elements and the Schottky barrier diode cut off the high-frequency signal and the DC signal respectively, and lead static electricity applied to the signal terminal to ground so as to protect the internal circuit against the static electricity.

By this arrangement, it is possible to prevent the high-frequency signal from leaking by means of the first high-frequency cut-off element of the first trap circuit together with the second high-frequency cut-off element of the second trap circuit and prevent the DC signal from flowing through to ground by means of the Schottky barrier diode of the first trap circuit through its reverse voltage characteristic and the capacitor inserted in the transmission line. Thus, it is possible to protect the internal circuit against the static electricity by leading the static electricity applied to the signal terminal to ground through the first high-frequency cut-off element and the Schottky barrier diode of the first trap circuit. Furthermore, it is also possible to remove electrical charge from the DC cut-off capacitor by means of the second high-frequency cut-off element provided in the second trap circuit and having one end thereof connected to ground.

According to another aspect of the invention, the high-frequency cut-off element is one of an inductor, a microstrip line, a microstrip line having a line length equal to a quarter of a wavelength of the high-frequency signal, and one of said microstrip lines has, around a perimeter thereof, a discharge ground pattern for discharging the static electricity applied to the signal terminal to ground. According to this arrangement, it is possible to cut off the high-frequency signal effectively, prevent the high-frequency signal from leaking to ground, and lead to ground the static electricity not including frequency components that would otherwise be cut off so as to protect the internal circuit against the static electricity.

DESCRIPTION OF THE DRAWINGS

This and other features of the present invention will become clear from the following description, taken in conjunction with the preferred embodiments with reference to the accompanying drawings in which:

FIG. 17 is a circuit diagram showing a partial internal circuit of the conventional switch box.

DESCRIPTION OF THE PREFERRED EMBODIMENTS

Figure 1:
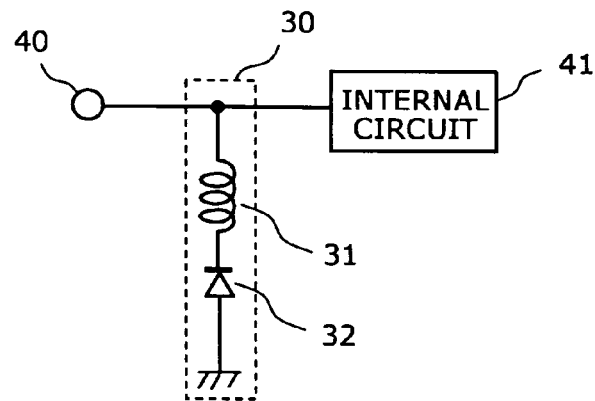
FIG. 1 is a circuit diagram of a static electricity protective circuit of a first embodiment of the invention.

Hereinafter, embodiments of the present invention will be described with reference to the drawings. FIG. 1 is a circuit diagram of a static electricity protective circuit of a first embodiment of the invention. In FIG. 1, reference numeral 40 represents a signal terminal through which an RF (high frequency) signal and a DC (direct current) signal are superimposed and transmitted. Reference numeral 41 represents an internal circuit connected to the signal terminal 40. It is to be noted that the signal terminal 40 corresponds, for example, to the connecting terminal 2b of the switch box 2 shown in FIG. 17, and that the internal circuit 41 corresponds, for example, to the circuit comprising the capacitor 21, the attenuator 22, the high-frequency switch circuit 23, the choke coil 24, the capacitor 25, and the surge absorber 26 shown in FIG. 17. Reference numeral 30 represents a static electricity protective circuit comprising an inductor 31 as a high-frequency cut-off element, and a Schottky barrier diode 32. The inductor 31 has one end thereof connected to the signal terminal 40 and other end thereof connected to a cathode of the Schottky barrier diode 32. An anode of the Schottky barrier diode 32 is connected to ground.

The static electricity protective circuit 30 shown in FIG. 1 serves as an LC filter formed by combining the inductor 31 and a capacitance residing in the Schottky barrier diode 32 so that the LC filter exhibits a particularly high impedance at a frequency of the RF signal fed to the signal terminal 40 and, thereby, prevents the RF signal from leaking. Simultaneously, the Schottky barrier diode 32, due to its reverse voltage characteristic, prevents the DC signal supplied to the signal terminal 40 from flowing through to ground. By taking advantage of its characteristics, as described later, in which forward and reverse voltages are low and the operation is performed at high speed, the Schottky barrier diode 32 is used to protect the internal circuit 41 by discharging static electricity applied to the signal terminal 40 to ground.

Figure 5:
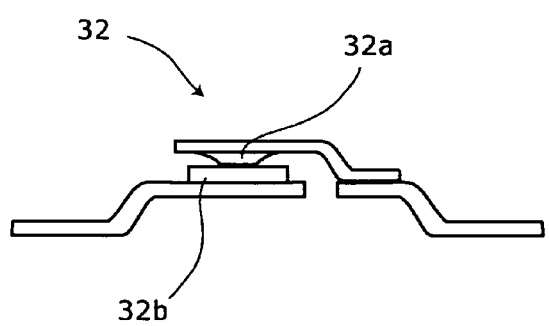
FIG. 5 is schematic diagram for explaining an internal structure of a Schottky barrier diode.

FIG. 5 is schematic diagram for explaining an internal structure of the Schottky barrier diode 32. The Schottky barrier diode 32 is a diode formed by a metal and a semiconductor joined to each other. As shown in FIG. 5, the Schottky barrier diode 32 takes on a structure in which an anode 32a made of a metal and a cathode made of an N-type semiconductor are joined to each other. The Schottky barrier produced at the junction is used. Because of this structure, the forward and reverse voltages are low when compared to an ordinary diode. Also, the Schottky barrier diode 32 can perform operations at high speed and lead the static electricity quickly to ground when the static electricity is applied to the anode 32a. The Schottky barrier diode 32 has also an advantage that it is not easily destroyed by the static electricity due to its high withstanding voltage.

Figure 2:
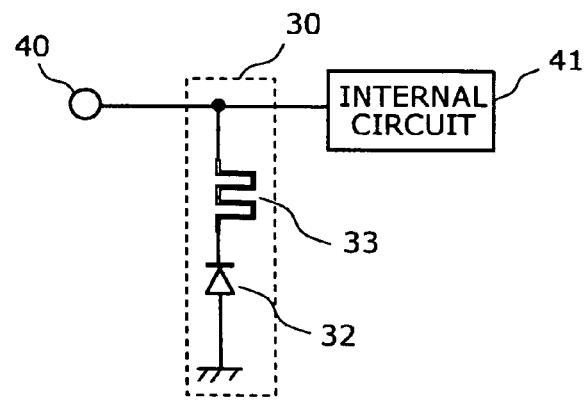
FIG. 2 is a circuit diagram of a static electricity protective circuit of a second embodiment of the invention.

FIG. 2 is a circuit diagram of a static electricity protective circuit of a second embodiment of the invention. In FIG. 2, such components as are found also in FIG. 1 are identified with the same reference numerals and descriptions thereof will not be repeated. A difference between the static electricity protective circuits 30 shown in FIG. 2 and FIG. 1 is that a microstrip line (high-frequency cut-off element) 33 is used in lieu of the inductor 31. The microstrip line 33 has one end thereof connected to the signal terminal 40 and other end thereof connected to the cathode of the Schottky barrier diode 32. The anode of the Schottky barrier diode 32 is connected to ground. To maximize the efficiency of preventing the RF signal from leaking, it is desirable that a line length of the microstrip line 33 be made equal to a quarter of a wavelength of the RF signal fed to the signal terminal 40.

In the static electricity protective circuit 30 configured in this way and shown in FIG. 2, since the microstrip line 33 having the line length equal to a quarter of the wavelength of the RF signal exhibits a high impedance to the frequency component of the RF signal, it is possible to prevent the RF signal fed to the signal terminal 40 from leaking. It is also possible, by means of the reverse voltage characteristic of the Schottky barrier diode 32, to prevent the DC signal fed to the signal terminal 40 from flowing through to ground. Furthermore, with respect to static electricity applied to the signal terminal 40, because the microstrip line 33 acts as a low-impedance conductor for the static electricity at the frequency components thereof, the Schottky barrier diode 32 is tuned on at high speed and leads the static electricity to ground as soon as the static electricity is applied. Consequently, a high voltage will not be applied to the internal circuit 41.

Figure 3:
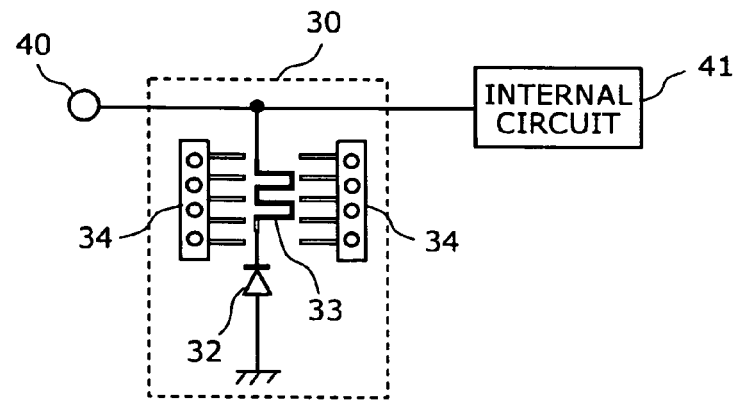
FIG. 3 is a circuit diagram of a static electricity protective circuit of a third embodiment of the invention.

FIG. 3 is a circuit diagram of a static electricity protective circuit of a third embodiment of the invention. In FIG. 3, such components as are found also in FIG. 2 are identified with the same reference numerals and descriptions thereof will not be repeated. A difference between the static electricity protective circuits 30 shown in FIG. 3 and FIG. 2 is that there are provided discharge ground patterns 34 connected to ground and laid in close proximity to the microstrip line 33 around its perimeter. By this arrangement, it is possible to discharge static electricity that is applied to the signal terminal 40 to ground easily and enhance the protection of the internal circuit 41 against the static electricity by leading a part of the static electricity to ground through the Schottky barrier diode 32. Here, it is to be noted that a shape and a location of the discharge ground pattern 34 shall be decided according to waveforms, voltages, and the like of the static electricity possibly applied to the signal terminal 40 so that the static electricity is easily discharged from the microstrip line 33. Furthermore, although the discharge ground patterns 34 are laid parallel to the microstrip line 33 along both sides thereof, it is possible to lay the discharge ground pattern 34 along only one side depending on the size of a substrate on which the microstrip line 33 is formed.

Figure 4:
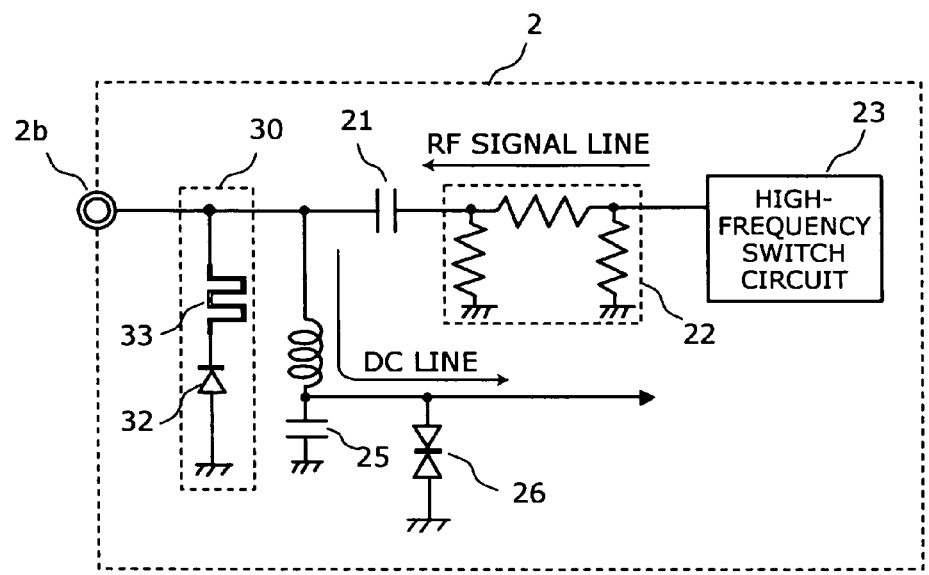
FIG. 4 is a circuit diagram showing a partial internal circuit of a switch box incorporating the static electricity protective circuit shown in FIG. 2.

FIG. 4 is a circuit diagram showing a partial internal circuit of a switch box, i.e., one of high-frequency circuit apparatuses, incorporating the static electricity protective circuit 30 shown in FIG. 2. In FIG. 4, such components as are found also in FIG. 17 are identified with the same reference numerals and descriptions thereof will not be repeated. A difference between the switch box 2 shown in FIG. 4 and the conventional switch box 2 shown in FIG. 17 is that a static electricity protective circuit 30 is provided for the connecting terminal 2b. A microstrip line 33 that forms the static electricity protective circuit 30 has one end thereof connected to the connecting terminal 2b and other end thereof connected to a cathode of a Schottky barrier diode 32. An anode of the Schottky barrier diode 32 is connected to ground. To maximize the efficiency of cutting off the RF signal, it is desirable that the line length of the microstrip line 33 be made equal to a quarter of a wavelength of the RF signal fed to the connecting terminal 2b.

In the switch box 2 configured in this way and shown in FIG. 4, since the microstrip line 33 exhibits high impedance to the RF signal, it is possible to prevent the RF signal transmitted between the connecting terminal 2b and the RF signal line from leaking. It is also possible for the Schottky barrier diode 32, by means of its reverse voltage characteristic, to prevent the DC current supplied to the connecting terminal 2b from flowing through to ground. Furthermore, with respect to static electricity applied to the connecting terminal 2b, because the microstrip line 33 acts as a low-impedance conductor for the static electricity at the frequency components thereof, the Schottky barrier diode 32 is tuned on at high speed and leads the static electricity to ground so that the internal circuit will be protected. Consequently, high voltages will not be applied to the internal circuit.

A static-electricity application test was conducted. In the test, ±20 kV static voltages are applied to the connecting terminal 2b of the switch box 2 shown in FIG. 4 and the connecting terminal 2b of the switch box 2 shown in FIG. 17, and results thereof were compared. According to the results, the static electricity applied to the internal circuit of the switch box 2 shown in FIG. 17 caused chip cracks in the ceramic capacitor 21 and electrostatic discharge damages in transistors constituting the high-frequency switch circuit 23. By contrast, the static electricity was not led to the internal circuit of the switch box 2 shown in FIG. 4 and caused no damages to the internal circuit, because the static electricity protective circuit 30 functioned effectively.

According to the aerial discharge test conducted on the circuit configured as shown in FIG. 4, circuit protection against ±20 kV was achieved and, thus it was concluded that the circuit protection against ordinary static electricity would be sufficiently achieved. However, under repeated applications of static electricity, it was noticed that accumulation of electricity was caused in the capacitor 21 that cuts off a DC component, and this caused progressive deterioration of the capacitor 21. With this as a backdrop, described hereinafter are static electricity protective circuits having an increased protection performance against static electricity and capable of preventing the capacitor 21 from deteriorating by suppressing or removing electricity accumulation therein caused by repeated applications of static electricity.

Figure 6:
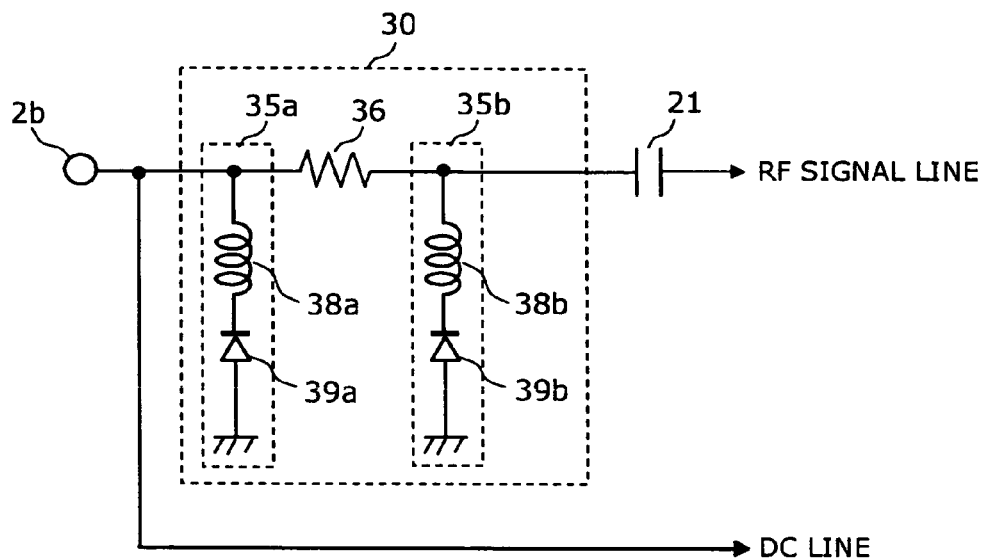
FIG. 6 is a circuit diagram of a static electricity protective circuit of a fourth embodiment of the invention.

FIG. 6 is a circuit diagram of a static electricity protective circuit of a fourth embodiment of the invention, and is shown as an example fitted to the switch box 2 shown in FIG. 4. In FIG. 6, such components as are found also in FIG. 4 are identified with the same reference numerals, and circuits located downstream of a capacitor 21 on the side of the RF signal line and circuits located on the side of the DC line are not omitted.

A static electricity protective circuit 30 shown in FIG. 6 comprises two trap circuits 35a and 35b, and a resistor 36. The trap circuit 35a is comprised of an inductor 38a and a Schottky barrier diode 39a. One end of the inductor 38a is connected to a connecting terminal 2b and other end thereof is connected a cathode of the Schottky barrier diode 39a. An anode of the Schottky barrier diode 39a is connected to ground. The trap circuit 35b is comprised of an inductor 38b and a Schottky barrier diode 39b. One end of the inductor 38b is connected to the capacitor 21 and also connected to the connecting terminal 2b through the resistor 36. Other end of the inductor 38b is connected to a cathode of the Schottky barrier diode 39b. An anode of the Schottky barrier diode 39b is connected to ground.

The static electricity protective circuit 30, shown in FIG. 6, configured in this way prevents, through a combined use of an inductor 38a and a Schottky barrier diode 39a, an RF signal transmitted through the RF signal line from leaking to ground, and also prevents, by means of a reverse voltage characteristic of the Schottky barrier diode 39a, a DC signal supplied to the connecting terminal 2b from flowing through to ground. In a similar manner, a combination of the inductor 38b and the Schottky barrier diode 39b prevents the RF signal transmitted through the RF signal line from leaking to ground and, by means of a reverse voltage characteristic of the Schottky barrier diode 39b, also prevents the DC signal that is supplied to the connecting terminal 2b from flowing through to ground.

Also, the inductor 38a exhibits low impedance to frequency components of static electricity applied externally to the connecting terminal 2b. Therefore, although the static electricity is applied to the Schottky barrier diode 38a, the Schottky barrier diode 38a is turned on at high speed and protects the internal circuit by leading the static electricity to ground. Moreover, even if the static electricity can not be removed entirely by the trap circuit 35a, the static electricity is led to ground by the Schottky barrier diode 39b after having been attenuated by the resistor 36. The static electricity, eliminated by the trap circuit 35a, the resistor 36, and the trap circuit 35b, will not be applied to the capacitor 21. Even if the static electricity is not entirely eliminated, the static electricity attenuated already will be applied to the capacitor 21, thereby causing no accumulation of electricity or reduced accumulation of electricity therein.

By this configuration, it is possible to further enhance the performance of protecting the internal circuit against static electricity. Even if the static electricity is applied repeatedly, accumulation of electricity in the capacitor 21 will not be caused, or will be reduced. Therefore, it is possible to prevent the capacitor 21 from deteriorating.

Figure 7:
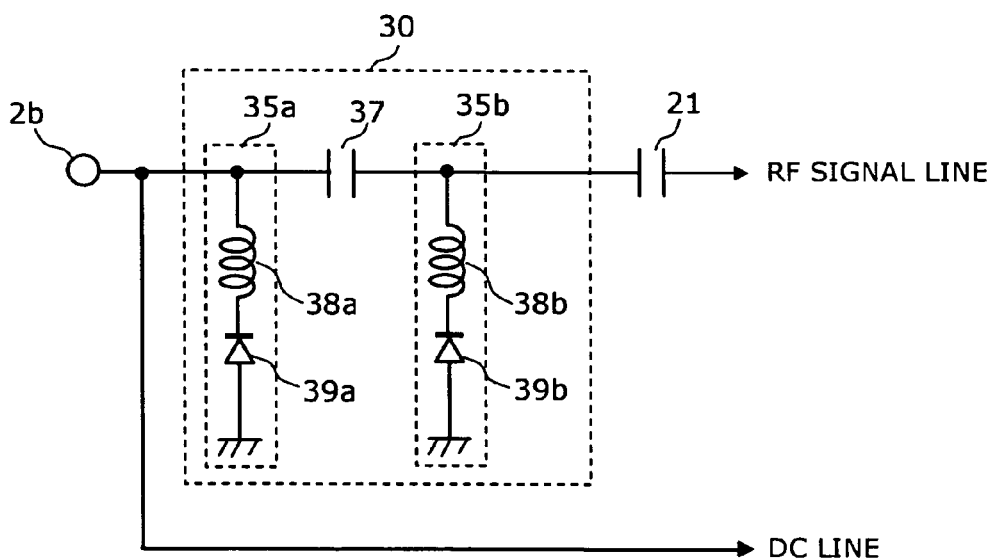
FIG. 7 is a circuit diagram of a static electricity protective circuit of a fifth embodiment of the invention.

FIG. 7 is a circuit diagram of a static electricity protective circuit of a fifth embodiment of the invention. In FIG. 7, such components as are found also in FIG. 6 are identified with the same reference numerals and descriptions thereof will not be repeated. A difference between the static electricity preventive circuits 30 shown in FIG. 7 and FIG. 6 is that a capacitor 37 is inserted in lieu of the resistor 36 so as to prevent electricity from building up in the capacitor 21, which is caused by external applications of static electricity to the connecting terminal 2b.

The static electricity protective circuit 30 configured in this way and shown in FIG. 7 prevents, through a combined use of an inductor 38a and a Schottky barrier diode 39a, an RF signal transmitted through the RF signal line from leaking to ground, and also prevents, by means of a reverse voltage characteristic of the Schottky barrier diode 39a, a DC signal supplied to the connecting terminal 2b from flowing through to ground. Moreover, even if the static electricity can not be removed by a trap circuit 35a entirely, the static electricity is also led to ground through a Schottky barrier diode 39b after having been attenuated when passing through the capacitor 37. The static electricity, eliminated by the trap circuit 35a, the capacitor 37, and the trap circuit 35b, will not be applied to the capacitor 21. Even if the static electricity is not entirely eliminated, the static electricity attenuated already will be applied to the capacitor 21, thereby causing no accumulation of electricity or reduced accumulation of electricity therein.

By this configuration, it is possible to further enhance the performance of protecting the internal circuit against static electricity. Even if the static electricity is applied repeatedly, accumulation of electricity in the capacitor 21 will not be caused, or will be reduced. Therefore, it is possible to prevent the capacitor 21 from deteriorating.

Figure 8:
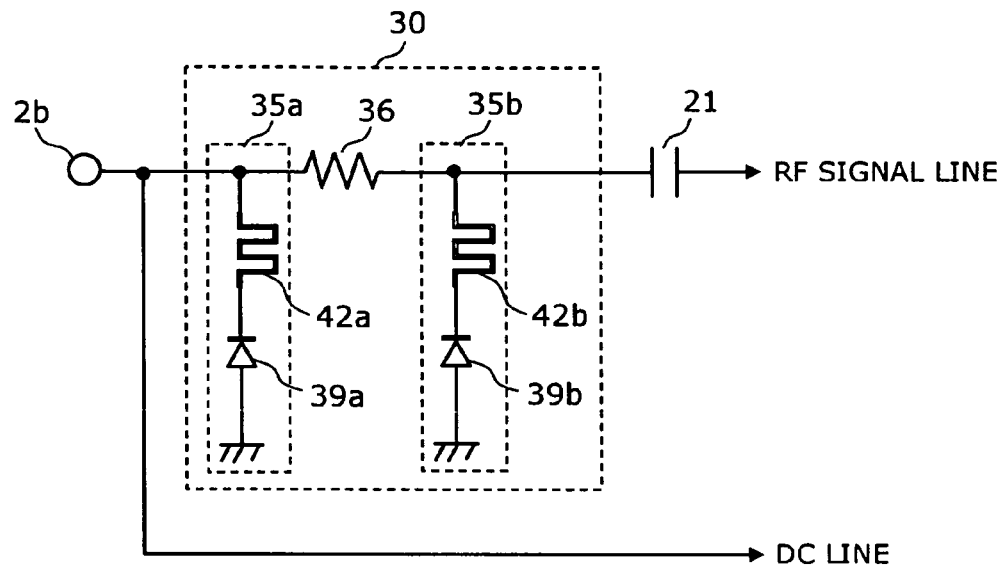
FIG. 8 is a circuit diagram of a static electricity protective circuit of a sixth embodiment of the invention.

FIG. 8 is a circuit diagram of a static electricity protective circuit of a sixth embodiment of the invention. In FIG. 8, such components as are found also in FIG. 6 are identified with the same reference numerals and descriptions thereof will not be repeated. A difference between the static electricity preventive circuits 30 shown in FIG. 8 and FIG. 6 is that a trap circuit 35a is formed by a microstrip line 42a in lieu of the inductor 38a, and that a trap circuit 35b is formed by a microstrip line 42b in lieu of the inductor 38b. It is desirable that the microstrip lines 42a and 42b be so formed as to have line lengths thereof equal to a quarter of a wavelength of the RF signal transmitted through the RF signal line.

The static electricity protective circuit 30 configured in this way and shown in FIG. 8 prevents, through a combined use of the microstrip line 42a and a Schottky barrier diode 39a, an RF signal transmitted through the RF signal line from leaking to ground, and also prevents, by means of a reverse voltage characteristic of the Schottky barrier diode 39a, a DC signal supplied to the connecting terminal 2b from flowing through to ground. In a similar manner, a combination of the microstrip line 42b and a Schottky barrier diode 39b prevents the RF signal transmitted through the RF signal line from leaking to ground, and also prevents, by means of the reverse voltage characteristic of the Schottky barrier diode 39b, the DC signal supplied to the connecting terminal 2b from flowing through to ground.

Also, the microstrip line 42a exhibits low impedance to frequency components of static electricity that is applied externally to the connecting terminal 2b. Therefore, although the static electricity is applied to the Schottky barrier diode 38a, the Schottky barrier diode 38a is turned on at high speed and protects the internal circuit by leading the static electricity to ground. Moreover, even if the static electricity can not be removed by the trap circuit 35a entirely, the static electricity is also led to ground through the Schottky barrier diode 39b after having been attenuated by the resistor 36. The static electricity, eliminated by the trap circuit 35a, the resistor 36, and the trap circuit 35b, will not be applied to the capacitor 21. Even if the static electricity is not entirely eliminated, the static electricity attenuated already will be applied to the capacitor 21, thereby causing no accumulation of electricity or reduced accumulation of electricity therein.

By this configuration, it is possible to further enhance the performance of protecting the internal circuit against static electricity. Even if the static electricity is applied repeatedly, accumulation of electricity in the capacitor 21 will not be caused, or will be reduced. Therefore, it is possible to prevent the capacitor 21 from deteriorating.

Figure 9:
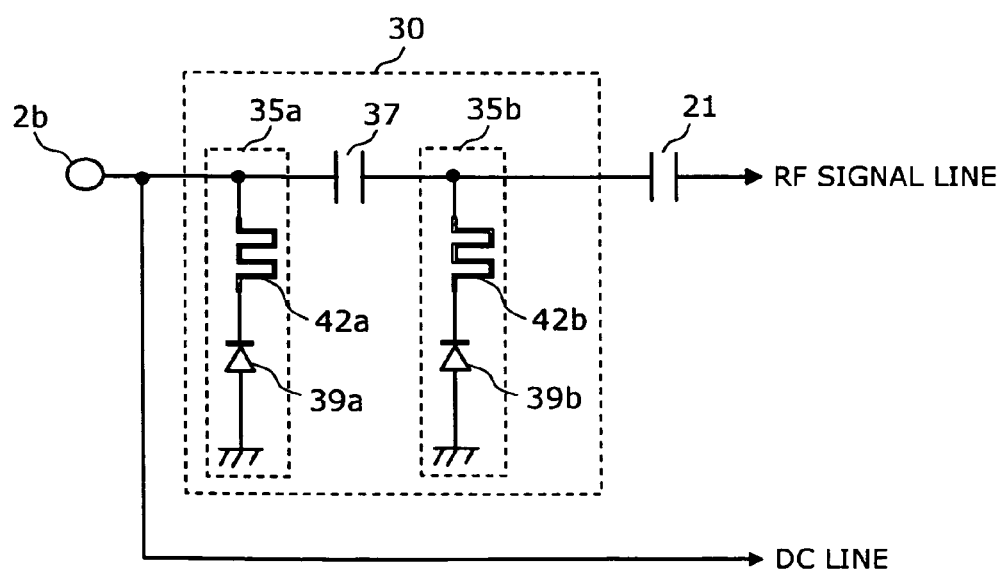
FIG. 9 is a circuit diagram of a static electricity protective circuit of a seventh embodiment of the invention.

FIG. 9 is a circuit diagram of a static electricity protective circuit of a seventh embodiment of the invention. In FIG. 9, such components as are found also in FIG. 8 are identified with the same reference numerals and descriptions thereof will not be repeated. A difference between the static electricity preventive circuits 30 shown in FIG. 9 and FIG. 8 is that a capacitor 37 is inserted in lieu of the resistor 36 so as to prevent electricity from building up in the capacitor 21, which is caused by external applications of static electricity to the connecting terminal 2b.

The static electricity protective circuit 30 configured in this way and shown in FIG. 9 prevents, through a combined use of a microstrip line 42a and a Schottky barrier diode 39a, an RF signal transmitted through the RF signal line from leaking to ground, and also prevents, by means of a reverse voltage characteristic of the Schottky barrier diode 39a, a DC signal supplied to the connecting terminal 2b from flowing through to ground. Moreover, even if the static electricity can not be removed by a trap circuit 35a entirely, the static electricity is also led to ground through a Schottky barrier diode 39b after having been attenuated when passing through the capacitor 37. The static electricity, eliminated by the trap circuit 35a, the capacitor 37, and the trap circuit 35b, will not be applied to the capacitor 21. Even if the static electricity is not entirely eliminated, the static electricity attenuated already will be applied to the capacitor 21, thereby causing no accumulation of electricity or reduced accumulation of electricity therein.

By this configuration, it is possible to further enhance the performance of protecting the internal circuit against static electricity. Even if the static electricity is applied repeatedly, accumulation of electricity in the capacitor 21 will not be caused, or will be reduced. Therefore, it is possible to prevent the capacitor 21 from deteriorating.

Figure 10:
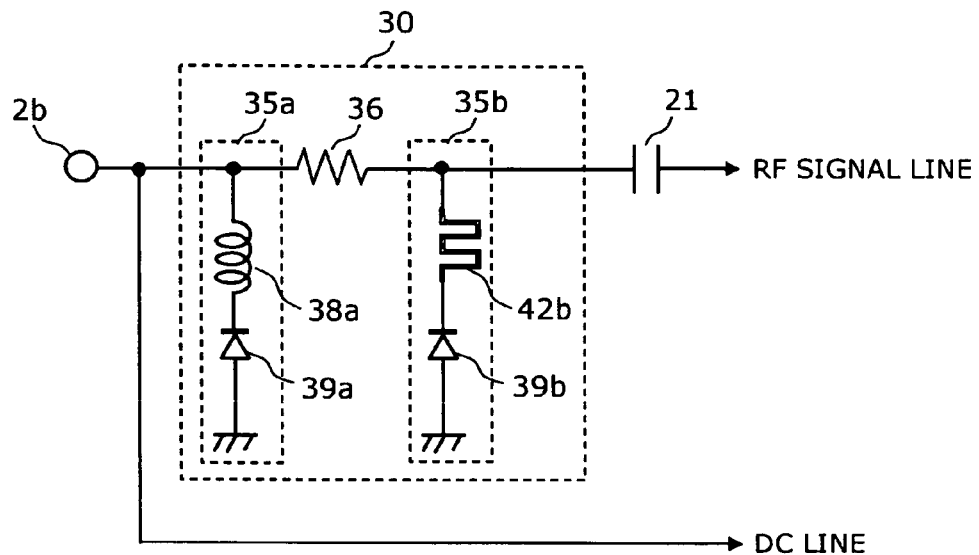
FIG. 10 is a circuit diagram of a static electricity protective circuit of an eighth embodiment of the invention.

FIG. 10 is a circuit diagram of a static electricity protective circuit of an eighth embodiment of the invention. In FIG. 10, such components as are found also in FIG. 8 are identified with the same reference numerals and descriptions thereof will not be repeated. A difference between the static electricity preventive circuit 30 shown in FIG. 10 and FIG. 8 is that a trap circuit 35a is formed by an inductor 38a and a Schottky barrier diode 39a, and that a trap circuit 35b is formed by a microstrip line 42b and a Schottky barrier diode 39b.

Although not shown in the drawing, it is also possible to form the trap circuit 35a by a microstrip line 42a and the Schottky barrier diode 39a as shown in FIG. 8, and form the trap circuit 35b by an inductor 38b and the Schottky barrier diode 39b as shown in FIG. 6. For example, in the circuit shown in FIG. 8, if the RF signals at different frequencies are transmitted through the RF signal line, and the microstrip lines 42a and 42b are formed so as to have a line length equal to a quarter of a wavelength of a particular frequency of the RF signals, it is possible that the high-frequency cut-off performance for other frequencies different from the particular frequency becomes insufficient. If an inductor is used instead, the RF signals at different frequencies can be cut off to a certain degree, because a cut-off frequency curve thereof becomes a gentle slope line. However, as shown in FIG. 6, if the inductors 38a and 39a are used for both of the trap circuits 35a and 35b, miniaturization of the static electricity protective circuit 30 may not be achieved depending on the size of the inductors. In this case, it is possible to use the static electricity protective circuit 30 of the sixth embodiment.

The static electricity protective circuit 30 configured in this way and shown in FIG. 10 prevents, through a combined use of an inductor 38a (or a microstrip line 42a) and a Schottky barrier diode 39a, an RF signal transmitted through the RF signal line from leaking to ground, and also prevents, by means of a reverse voltage characteristic of the Schottky barrier diode 39a, a DC signal supplied to the connecting terminal 2b from flowing through to ground. Moreover, even if the static electricity can not be removed by the trap circuit 35a entirely, the static electricity is also led to ground through the Schottky barrier diode 39b after having been attenuated when passing through the resistor 36. The static electricity, eliminated by the trap circuit 35a, the resistor 36, and the trap circuit 35b, will not be applied to the capacitor 21. Even if the static electricity is not entirely eliminated, the static electricity attenuated already will be applied to the capacitor 21, thereby causing no accumulation of electricity or reduced accumulation of electricity therein.

By this configuration, it is possible to further enhance the performance of protecting the internal circuit against static electricity. Even if the static electricity is applied repeatedly, accumulation of electricity in the capacitor 21 will not be caused, or will be reduced. Therefore, it is possible to prevent the capacitor 21 from deteriorating.

Figure 11:
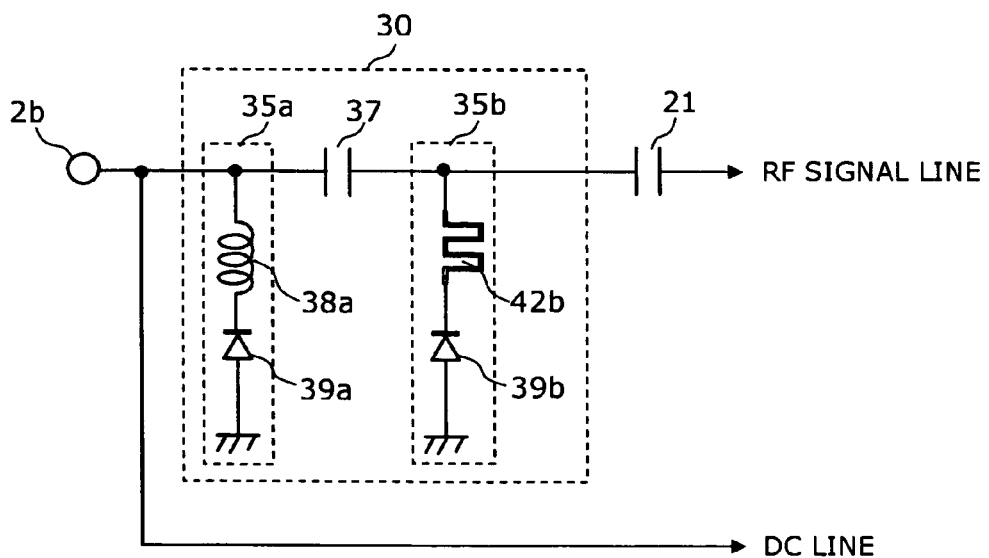
FIG. 11 is a circuit diagram of a static electricity protective circuit of a ninth embodiment of the invention.

FIG. 11 is a circuit diagram of a static electricity protective circuit of a ninth embodiment of the invention. In FIG. 11, such components as are found also in FIG. 10 are identified with the same reference numerals and descriptions thereof will not be repeated. A difference between the static electricity preventive circuits 30 shown in FIG. 11 and FIG. 10 is that a capacitor 37 is inserted in lieu of the resistor 36 for preventing electricity from building up in the capacitor 21 by static electricity applied externally to the connecting terminal 2b. The reason why one of the trap circuits 35a and 35b is formed by an inductor and other is formed by a microstrip line is the same as that applied to the sixth embodiment.

The static electricity protective circuit 30 configured in this way and shown in FIG. 11 prevents, through a combined use of an inductor 38a (or a microstrip line 42a) and a Schottky barrier diode 39a, an RF signal transmitted through the RF signal line from leaking to ground, and also prevents, by means of a reverse voltage characteristic of the Schottky barrier diode 39a, a DC signal supplied to the connecting terminal 2b from flowing through to ground. Moreover, even if the static electricity can not be removed by the trap circuit 35a entirely, the static electricity is also led to ground through the Schottky barrier diode 39b after having been attenuated when passing through the capacitor 37. The static electricity, eliminated by the trap circuit 35a, the capacitor 37, and the trap circuit 35b, will not be applied to the capacitor 21. Even if the static electricity is not entirely eliminated, the static electricity attenuated already will be applied to the capacitor 21, thereby causing no accumulation of electricity or reduced accumulation of electricity therein.

By this configuration, it is possible to further enhance the performance of protecting the internal circuit against static electricity. Even if the static electricity is applied repeatedly, accumulation of electricity in the capacitor 21 will not be caused, or will be reduced. Therefore, it is possible to prevent the capacitor 21 from deteriorating.

Figure 12A:
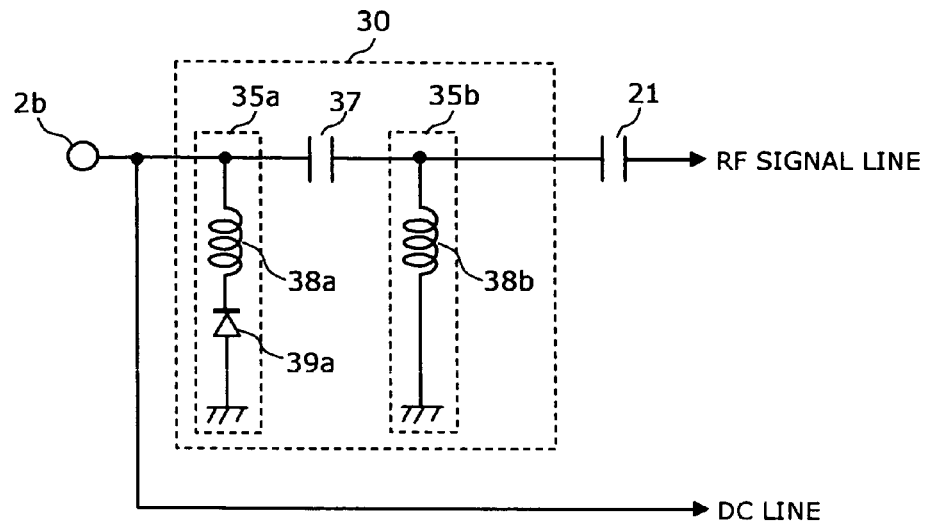
FIG. 12A is a circuit diagram showing a first example of a static electricity protective circuit of a tenth embodiment of the invention.
Figure 12B:
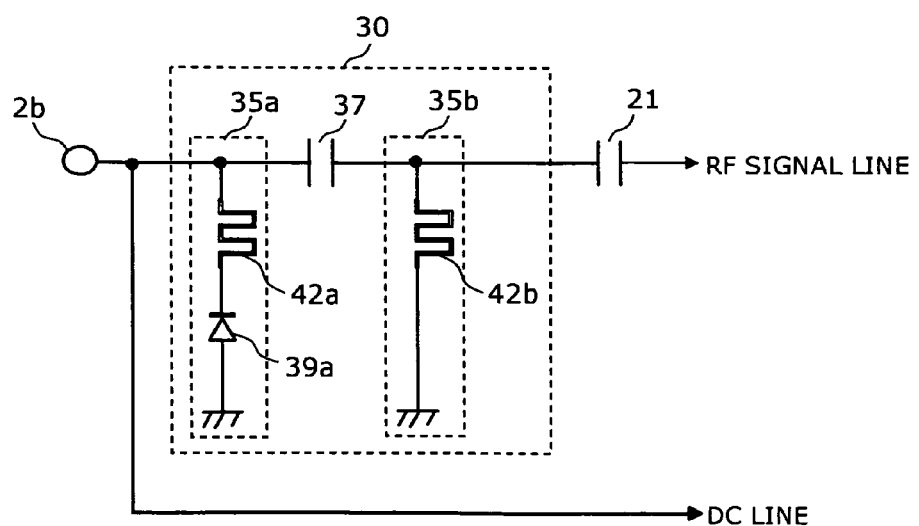
FIG. 12B is a circuit diagram showing a second example of the static electricity protective circuit of the tenth embodiment of the invention.
Figure 12C:
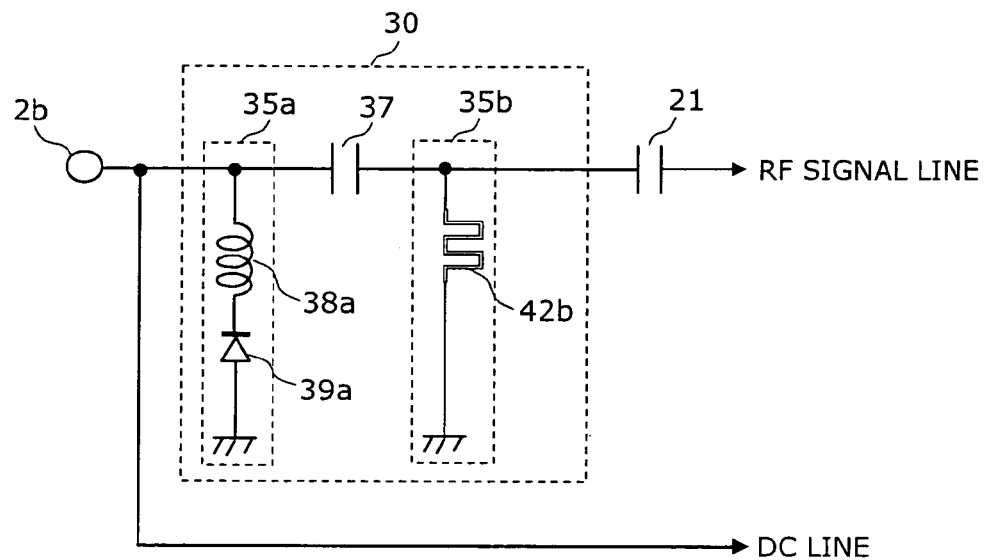
FIG. 12C is a circuit diagram showing a third example of the static electricity protective circuit of the tenth embodiment of the invention.
Figure 12D:
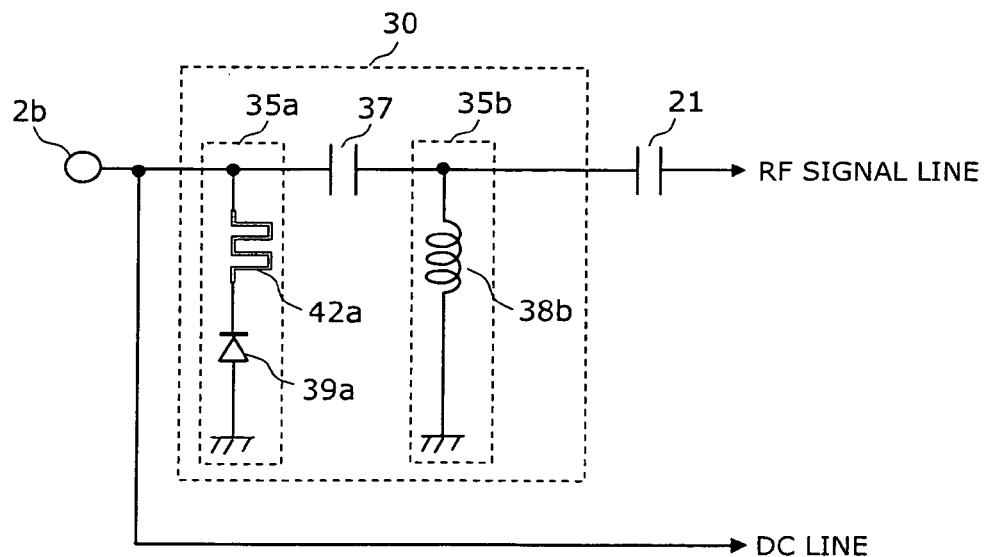
FIG. 12D is a circuit diagram showing a forth example of the static electricity protective circuit of the tenth embodiment of the invention.
Figure 13A:
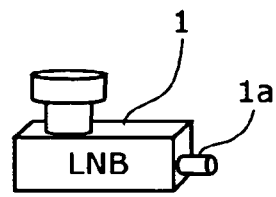
FIG. 13A is an exterior view of an ordinary LNB.
Figure 13B:
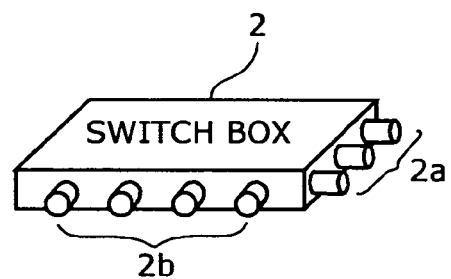
FIG. 13B is an exterior view of an ordinary switch box.
Figure 13C:
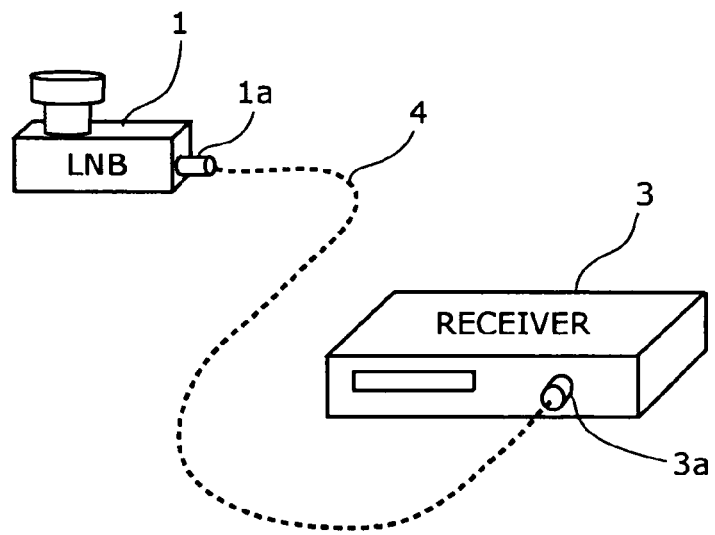
FIG. 13C is an exterior view showing a connection between the ordinary LNB and an ordinary receiver.
Figure 14:
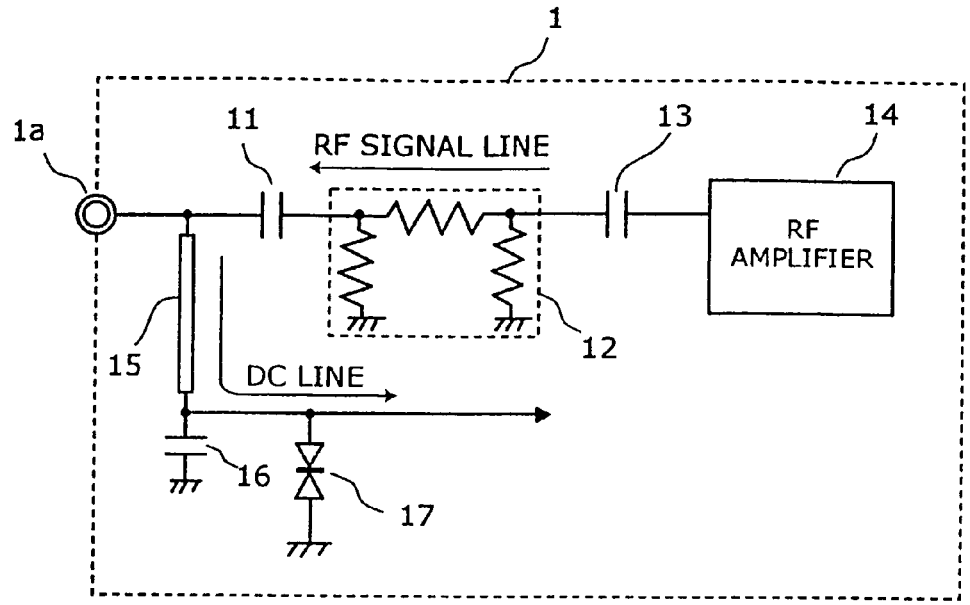
FIG. 14 is a circuit diagram showing a partial internal circuit of a conventional LNB.
Figure 15:
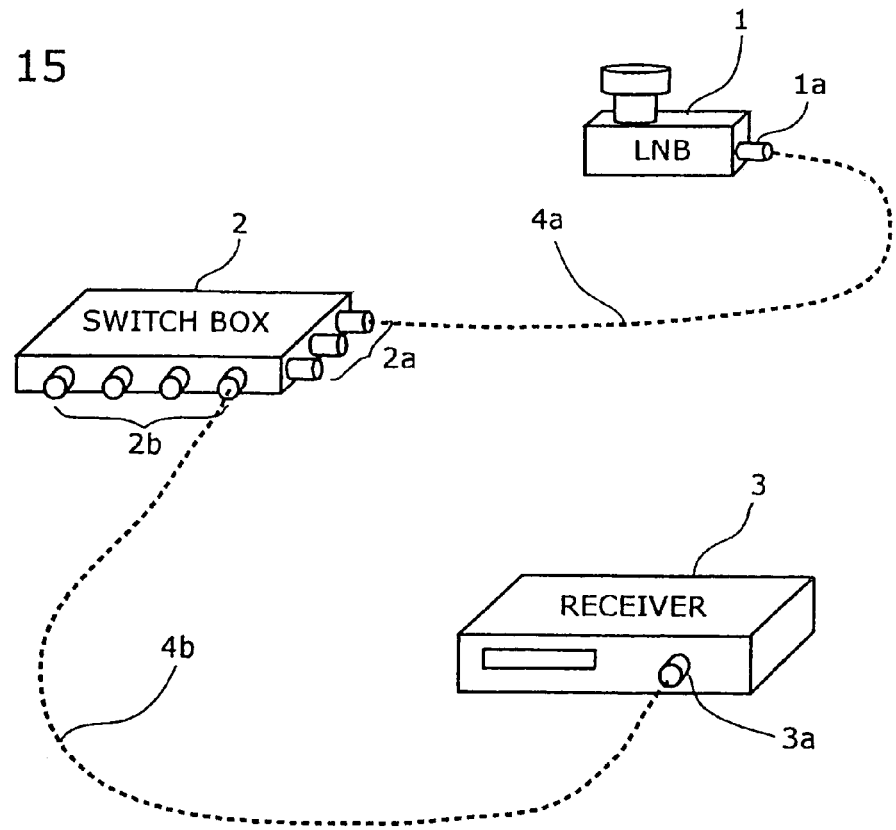
FIG. 15 is an exterior view showing an interconnection among the LNB, the switch box, and the receiver.
Figure 16:
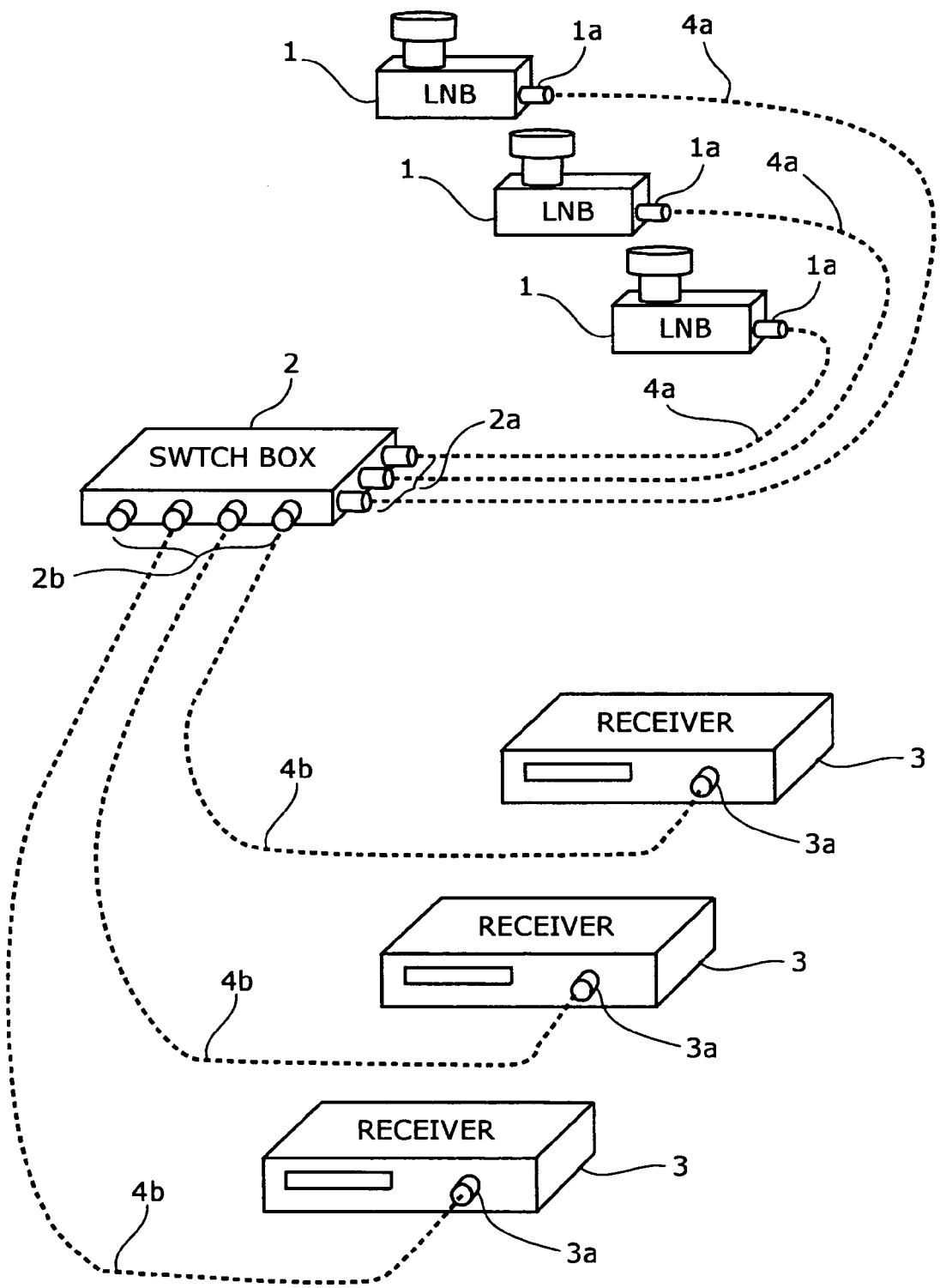
FIG. 16 is an exterior view showing another interconnection among the LNBs, the switch box, and the receivers.

FIGS. 12A to 12D are circuit diagrams showing a static electricity protective circuits of a tenth embodiment of the invention. FIG. 12A shows a first example; FIG. 12B shows a second example; FIG. 12C shows a third example: and FIG. 12D shows a fourth example. FIG. 12A corresponds to FIG. 7; FIG. 12B corresponds to FIG. 9; and FIGS. 12C and 12D correspond to FIG. 11. Therefore, in FIGS. 12A to 12D, such components as are found also in FIGS. 7, 9, and 11 are identified with the same reference numerals and descriptions thereof will not be repeated. Each of static electricity preventive circuits 30 shown in FIGS. 12A to 12D is different from the static electricity preventive circuit 30 shown in the drawing corresponding thereto with respect to the trap circuit 35*b* from which the Schottky barrier diode 39*b* is omitted.

In the static electricity protective circuits 30 configured in this way and shown in FIGS. 12A to 12D, removal of static electricity by the trap circuit 35*a* is performed in the same manner as described earlier. If the removal of static electricity by the trap circuit 35*a* is substantially sufficient, it is possible to remove the Schottky barrier diode 38*b* from the trap circuit 35*b* and, thereby achieve reductions in size and cost of the static electricity protective circuit 30.

Here, it is to be noted that, although the static electricity protective circuits 30 shown in FIGS. 6 to 12D are comprised of two trap circuits 35*a* and 35*b*, it is also possible to form a static electricity protective circuit 30 by using three or more similar trap circuits so as to enhance the protective performance against static electricity. It is also possible to provide such a discharge ground pattern 34 as shown in FIG. 3 around the perimeter of the microstrip lines 42*a* and/or 42*b* of the static electricity protective circuits 30 shown in FIGS. 8 to 12D.

It is necessary to arrange a static electricity protective circuit 30 as described in the embodiments for each of all the connecting terminals 2*a* and 2*b* of the switch box 2. This is because devices such as the ceramic capacitor 21 arranged in the RF signal line for cutting off the DC components and transistors constituting the high-frequency switch circuit 23 are possibly deteriorated or damaged by applications of static electricity to the connecting terminals 2*a* and 2*b*, and the protection efficiency will suffer unless the static electricity protective circuits 30 are arranged closer to nodes between each of the connecting terminals 2*a* and 2*b*, and the internal circuit. For example, in an actual substrate used for the switch box 2, since the RF signal is transmitted through a circuit pattern that forms a microstrip line, it is necessary to place the static electricity protective circuit 30 in close proximity to a core conductor of each terminal soldered to that circuit pattern.

As described earlier, the static electricity protective circuits 30 shown in FIGS. 1 to 3 can prevent the high-frequency signal transmitted to the signal terminal 40 from leaking, also prevent the DC signal supplied to the signal terminal 40 from flowing through to ground, and prevent, by leading to ground the static electricity that is applied externally to the signal terminal 40, devices constituting the internal circuit 41 that is connected to the signal terminal 40 from being deteriorated, damaged, and so forth.

Furthermore, because the switch box 2 shown in FIG. 4 and having the static electricity protective circuit 30 connected to the connecting terminal 2*b* can lead static electricity that is applied to the connecting terminal 2*b* to ground without causing transmission losses in the RF signal transmitted to the connecting terminal 2*b* and without causing leaking of the DC current that is supplied to the connecting terminal 2*b* to ground, a high voltage resulted from the static electricity will not be applied to the internal circuit and the devices constituting the internal circuit will not be deteriorated or damaged. As a result, it is possible to protect the internal circuit against static electricity.

If the static electricity protective circuit 30 shown in FIG. 4 is replaced with one of the static electricity protective circuits 30 shown in FIGS. 6 to 12D, it is possible to prevent a high-frequency signal fed to the connecting terminal 2*d* from leaking, prevent a DC signal fed to the connecting terminal 2*d* from flowing to ground, and provide further protection for devices constituting the internal circuit 23 that is connected to the connecting terminal 2*b* against deterioration, damage, and so forth, by leading the static electricity applied externally to the connecting terminal 2*b* to ground. Moreover, even if the static electricity is repeatedly applied thereto, it is possible to prevent the capacitor 21 from developing deterioration because accumulation of electricity in the capacitor 21 that forms the internal circuit and provided for cutting off DC current can be prevented entirely or reduced.

In the descriptions, although a switch box is taken as an example as an apparatus provided with the static electricity protective circuit embodying the invention, it is also possible to apply the static electricity protective circuit embodying the invention to other high-frequency circuit apparatuses that deal with a high-frequency signal such as LNBs, receivers, and the like. It is to be understood that the present invention is not limited to the embodiments as described above and that within the scope of the appended claims, the invention may be practiced other than as specifically described.

What is claimed is:

1. A static electricity protective circuit for use in a high-frequency apparatus for protecting, against static electricity, an internal circuit connected to a signal terminal through which a high-frequency signal that is transmitted from the internal circuit of the high-frequency apparatus to outside and a DC (Direct Current) signal are superimposed and transmitted, the DC signal being provided to the signal terminal from an external device as a power source for driving the high-frequency apparatus, comprising:

a high-frequency cut-off element having a first end thereof connected to a node between the signal terminal and a first end of a DC current cut-off capacitor having a second end thereof connected to the internal circuit to cut off the DC signal, the high-frequency signal and the DC signal being applied to the high-frequency cut-off element through the node; and a Schottky barrier diode having a cathode thereof connected to a second end of the high-frequency cut-off element and an anode thereof connected to ground, wherein the DC signal is applied to the first end of the high-frequency cut-off element through the signal terminal and flows into the internal circuit through another circuit by bypassing the high-frequency cut-off element, the high-frequency cut-off element cuts off the high-frequency signal which is applied to said first end of the high-frequency cut-off element, the Schottky barrier diode has a reverse voltage characteristic thereof that causes the DC signal which has been applied to said first end of the high-frequency cut-off element to be cut off so as not to flow through the high-frequency cut-off element, and the high-frequency cut-off element and the Schottky barrier diode together lead static electricity applied to the signal terminal to ground so as to protect the internal circuit against the static electricity.

2. The static electricity protective circuit as claimed in claim 1, wherein the high-frequency cut-off element is an inductor.

3. The static electricity protective circuit as claimed in claim 1, wherein the high-frequency cut-off element is a microstrip line.

4. The static electricity protective circuit as claimed in claim 1, wherein the high-frequency cut-off element is a microstrip line having a line length equal to a quarter of a wavelength of the high-frequency signal.

5. The static electricity protective circuit as claimed in claim 3, wherein a discharge ground pattern is provided around a perimeter of the microstrip line so as to discharge the static electricity applied to the signal terminal to ground.

6. The static electricity protective circuit as claimed in claim 4,
wherein a discharge ground pattern is provided around a perimeter of the microstrip line so as to discharge the static electricity applied to the signal terminal to ground.

7. A static electricity protective circuit for use in a high-frequency apparatus for protecting, against static electricity, an internal circuit connected to a signal terminal through which a high-frequency signal that is transmitted from the internal circuit of the high-frequency apparatus to outside and a DC (Direct Current) signal are superimposed and transmitted, the DC signal being provided to the signal terminal from an external device as a power source for driving the high-frequency apparatus, comprising:
a first trap circuit comprising:
a first high-frequency cut-off element having a first end thereof connected to the signal terminal, the high-frequency signal and the DC signal being applied to the first high-frequency cut-off element through said first end, and
a first Schottky barrier diode having a cathode thereof connected to a second end of the first high-frequency cut-off element and an anode thereof connected to ground,
a resistor having a first end thereof connected to the signal terminal and a second end thereof connected to a first end of a DC current cut-off capacitor having a second end thereof connected to the internal circuit so as to cut off the DC signal; and
a second trap circuit comprising:
a second high-frequency cut-off element having a first end thereof connected to a node between the resistor and said first end of the DC current cut-off capacitor, the high-frequency signal and the DC signal being applied to the second high-frequency cut-off element through said first end thereof, and
a second Schottky barrier diode having a cathode thereof connected to a second end of the second high-frequency cut-off element and an anode thereof connected to ground, wherein
the resistor is the sole element that connects one end of the first trap circuit and one end of the second trap circuit together,
the DC signal is applied to said first end of the first high-frequency cut-off element and said first end of the second high-frequency cut-off element through the signal terminal and flows into the internal circuit through another circuit by bypassing the first and second high-frequency cut-off elements,
the first and second high-frequency cut-off elements cut off the high-frequency signal applied to said first ends thereof, respectively,
each of the first and second Schottky barrier diodes has a reverse voltage characteristic thereof that causes the DC signal which has been applied to said first ends of the first and second high-frequency cut-off elements to be cut off so as not to flow through the first and second high-frequency cut-off elements,
the first and second trap circuits together lead static electricity applied to the signal terminal to ground so as to protect the internal circuit against the static electricity, and
the resistor and the second trap circuit prevent electricity accumulation from progressing in the DC current cut-off capacitor.

8. The static electricity protective circuit as claimed in claim 7, wherein the first and second high-frequency cut-off elements are inductors.

9. The static electricity protective circuit as claimed in claim 7, wherein the first and second high-frequency cut-off elements are microstrip lines.

10. The static electricity protective circuit as claimed in claim 7,
wherein the first and second high-frequency cut-off elements are microstrip lines each having a line length equal to a quarter of a wavelength of the high-frequency signal.

11. The static electricity protective circuit as claimed in claim 7,
wherein one of the first and second high-frequency cut-off elements is an inductor, and the other of the first and second high-frequency cut-off elements is a microstrip line.

12. The static electricity protective circuit as claimed in claim 9,
wherein discharge ground patterns are provided around a perimeter of each of the microstrip lines so as to discharge the static electricity applied to the signal terminal to ground.

13. The static electricity protective circuit as claimed in claim 10,
wherein discharge ground patterns are provided around a perimeter of each of the microstrip lines so as to discharge the static electricity applied to the signal terminal to ground.

14. The static electricity protective circuit as claimed in claim 11,
wherein a discharge ground pattern is provided around a perimeter of the microstrip line so as to discharge the static electricity applied to the signal terminal to ground.

15. A static electricity protective circuit for use in a high-frequency apparatus for protecting, against static electricity, an internal circuit connected to a signal terminal through which a high-frequency signal that is transmitted from the internal circuit of the high-frequency apparatus to outside and a DC (Direct Current) signal are superimposed and transmitted, the DC signal being provided to the signal terminal from an external device as a power source for driving the high-frequency apparatus, comprising:
a first trap circuit comprising:
a first high-frequency cut-off element having a first end thereof connected to the signal terminal, the high-frequency signal and the DC signal being applied to the first high-frequency cut-off element through said first end, and
a first Schottky barrier diode having a cathode thereof connected to a second end of the first high-frequency cut-off element and an anode thereof connected to ground;
a capacitor having a first end thereof connected to the signal terminal and a second end thereof connected to a first end of a DC current cut-off capacitor having a second end thereof connected to the internal circuit so as to cut off the DC signal; and
a second trap circuit comprising:
a second high-frequency cut-off element having a first end thereof connected to a node between the capacitor and said first end of the DC current cut-off capacitor, and
a second Schottky barrier diode having a cathode thereof connected to a second end of the second high-frequency cut-off element and an anode thereof connected to ground, wherein
the capacitor is the sole element that connects a first end of the first trap circuit and a first end of the second trap circuit together, the DC signal is applied to said first end of the first high-frequency cut-off element through the signal terminal and flows into the internal circuit through another circuit by bypassing the first high-frequency cut-off element, the first and second high-frequency cut-off elements cut off the high-frequency signal applied to said first ends thereof, respectively, the first Schottky barrier diode has a reverse voltage characteristic thereof that causes the DC signal which has been applied to said first end of the first high-frequency cut-off element to be cut off so as not to flow through the first high-frequency cut-off element, the first and second trap circuits together lead static electricity applied to the signal terminal to ground so as to protect the internal circuit against the static electricity, and the capacitor and the second trap circuit prevent electricity accumulation from progressing in the DC current cut-off capacitor.

16. The static electricity protective circuit as claimed in claim 15, wherein the first and second high-frequency cut-off elements are inductors.

17. The static electricity protective circuit as claimed in claim 15, wherein the first and second high-frequency cut-off element elements are microstrip lines.

18. The static electricity protective circuit as claimed in claim 15,
wherein the first and second high-frequency cut-off elements are microstrip lines each having a line length equal to a quarter of a wavelength of the high-frequency signal.

19. The static electricity protective circuit as claimed in claim 15,
wherein the first high-frequency cut-off element is an inductor, and the second high-frequency cut-off element is a microstrip line.

20. The static electricity protective circuit as claimed in claim 17,
wherein discharge ground patterns are provided around a perimeter of each of the microstrip lines so as to discharge the static electricity applied to the signal terminal to ground.

21. The static electricity protective circuit as claimed in claim 18,
wherein discharge ground patterns are provided around a perimeter of each of the microstrip lines so as to discharge the static electricity applied to the signal terminal to ground.

22. The static electricity protective circuit as claimed in claim 19,
wherein a discharge ground pattern is provided around a perimeter of the microstrip line so as to discharge the static electricity applied to the signal terminal to ground.

23. A static electricity protective circuit for use in a high-frequency apparatus for protecting, against static electricity, an internal circuit connected to a signal terminal through which a high-frequency signal that is transmitted from the internal circuit of the high-frequency apparatus to outside and a Direct Current signal are superimposed and transmitted, the DC signal being provided to the signal terminal from an external device as a power source for driving the high-frequency apparatus, comprising:
a first trap circuit comprising:
a first high-frequency cut-off element having a first end thereof connected to the signal terminal, the high-frequency signal and the DC signal being applied to the first high-frequency cut-off element through said first end, and
a first Schottky barrier diode having a cathode thereof connected to a second end of the first high-frequency cut-off element and an anode thereof connected to ground;
a capacitor having a first end thereof connected to the signal terminal and a second end thereof connected to a first end of a DC current cut-off capacitor having a second end thereof connected to the internal circuit so as to cut off the DC signal; and
a second trap circuit comprising:
a second high-frequency cut-off element having a first end thereof connected to a node between the capacitor and said first end of the DC current cut-off capacitor having a second end thereof connected to the internal circuit, the second high-frequency cut-off element having a second end thereof connected to ground, wherein
the capacitor is the sole element that connects one end of the first trap circuit and one end of the second trap circuit together, the DC signal is applied to said first end of the first high-frequency cut-off element through the signal terminal and flows into the internal circuit through another circuit by bypassing the first high-frequency cut-off element, the first and second high-frequency cut-off elements cut off the high-frequency signal applied to said first ends thereof, respectively, the Schottky barrier diode has a reverse voltage characteristic thereof that causes the DC signal which has been applied to said first end of the first high-frequency cut-off element to be cut off so as not to flow through the first high-frequency cut-off element, the first and second trap circuits lead static electricity applied to the signal terminal to ground so as to protect the internal circuit against the static electricity, and the capacitor and the second trap circuit prevent electricity accumulation from progressing in the DC current cut-off capacitor.

24. The static electricity protective circuit as claimed in claim 23,
wherein at least one of the first and second high-frequency cut-off elements is an inductor.

25. The static electricity protective circuit as claimed in claim 23,
wherein at least one of the first and second high-frequency cut-off elements is a microstrip line.

26. The static electricity protective circuit as claimed in claim 24,
wherein at least one of the first and second high-frequency cut-off elements is a microstrip line having a line length equal to a quarter of a wavelength of the high-frequency signal.

27. The static electricity protective circuit as claimed in claim 25,
wherein a discharge ground pattern is provided around a perimeter of the microstrip line so as to discharge the static electricity applied to the signal terminal to ground.

28. The static electricity protective circuit as claimed in claim 26,
wherein a discharge ground pattern is provided around a perimeter of the microstrip line so as to discharge the static electricity applied to the signal terminal to ground.

* * * * *